United States Patent
Kim et al.

(10) Patent No.: US 7,129,786 B2
(45) Date of Patent: Oct. 31, 2006

(54) BIAS CIRCUIT FOR SMART POWER AMPLIFIER

(75) Inventors: Tae-Jin Kim, Seoul (KR); Seung-Wook Lee, Seoul (KR); Byoung-Soo Kim, Incheon-si (KR); Yong-Woo Kim, Seoul (KR); Young-Woong Kim, Gyeonggi-do (KR); Jin-Ho Shin, Gyeonggi-Do (KR)

(73) Assignee: FCI Inc.(KR)

( * ) Notice: Subject to any disclaimer, the term of this patent is extended or adjusted under 35 U.S.C. 154(b) by 50 days.

(21) Appl. No.: 10/899,470

(22) Filed: Jul. 26, 2004

(65) Prior Publication Data
US 2005/0024148 A1 Feb. 3, 2005

(30) Foreign Application Priority Data
Aug. 1, 2003 (KR) .......................... 10-2003-53328

(51) Int. Cl.
*H03F 3/04* (2006.01)
(52) U.S. Cl. ........................ 330/297; 330/285; 330/296
(58) Field of Classification Search ................ 330/297, 330/285, 296
See application file for complete search history.

(56) References Cited

U.S. PATENT DOCUMENTS

| | | | | |
|---|---|---|---|---|
| 5,060,294 A | * | 10/1991 | Schwent et al. | 455/93 |
| 6,297,694 B1 | * | 10/2001 | Yamamoto | 330/51 |
| 6,753,734 B1 | * | 6/2004 | Arell et al. | 330/296 |
| 6,784,743 B1 | * | 8/2004 | Taniguchi et al. | 330/285 |

\* cited by examiner

*Primary Examiner*—Robert Pascal
*Assistant Examiner*—Hieu Nguyen
(74) *Attorney, Agent, or Firm*—Keusey, Tutunjian & Bitetto, P.C.

(57) ABSTRACT

A bias circuit for a smart power amplifier includes a high power mode bias circuit and a low power mode bias circuit, and operates only one of the bias circuits selectively using a switching circuit according to an input signal. Therefore, the bias circuit of high power mode and the bias circuit of the low power mode are divided and can be optimized according to characteristics of the power. Accordingly, a gain difference with respect to each power can be minimized and the low power mode can be controlled with a small amount of current in a state of initial current with a low power and in a middle power, such that an efficiency of the power amplifier can be improved at low power.

11 Claims, 4 Drawing Sheets

BIAS CIRCUIT FOR SMART POWER AMPLIFIER

FIELD OF THE INVENTION

The present invention generally relates to bias circuits and more specifically to bias circuits for smart switching mode power amplifiers.

BACKGROUND OF THE INVENTION

Recently, explosive developments in wireless communications have paved the way for communicating data through a portable terminal without limitations of time and place. However, many users have recognized various restrictions of conventional wireless communication services, and those restrictions need to be improved. Representative problems include short maximum call duration of the potable terminal and bad speech quality of the service. The maximum call duration of the portable terminal largely relates to a capacity of battery used in the portable terminal. The batteries that are commonly used are relatively small and light, and can be used for a relatively long time compared to the conventional batteries. However, performance of the batteries does not yet satisfy the user's needs and expectations. This is because a power amplifier module of the communication terminal has a low efficiency. A power consumption of the power amplifier module occupies much of (about 50~70%) the power consumption of the entire system, such that the low efficiency of the power amplifier module degrades the efficiency of the entire system and largely contributes to shorten the maximum call duration.

The conventional power amplifier used in the wireless terminal is comprised of a typical CLASS AB power amplifier that uses small amount of current at a low power and increases the amount of the current as an input power is raised up. This is an essential method for increasing call duration of the wireless terminal while using minimum power, and is the most widely used method in code division multi access (CDMA) methods in which the linearity is an important performance index.

FIG. 1 is a conventional bias circuit diagram 100 of a power amplifier. A conventional bias circuit 100 of the power amplifier is an emitter follower circuit using a negative feedback circuit. Referring to FIG. 1, the conventional bias circuit 100 includes a feedback transistor $Q_3$ 105 that is connected to an emitter of emitter follower stage transistor $Q_2$ 103 through a feedback resistor $R_1$ 107. A collector of the feedback transistor $Q_3$ 105 is connected to a reference voltage source Vref through a reference resistor $R_2$ 109. A base of the emitter follower stage transistor $Q_2$ 103 is connected to a node $N_1$ 113 between the reference resistor $R_2$ 109 and the feedback transistor $Q_3$ 105. A collector of the emitter follower stage transistor $Q_2$ 103 is connected to an operation voltage source Vcc and an emitter of the feedback transistor $Q_3$ 105 is grounded. A base of the power amplifier stage transistor $Q_1$ 101 is connected to a node $N_2$ 111 between the emitter follower stage transistor $Q_2$ 103 and the feedback resistor $R_1$ 107.

In this conventional bias circuit 100, an amount of current for the power amplifier transistor $Q_1$ 101 may be easily controlled using the reference resistor $R_2$ 109, and an amount of a feedback current may be controlled using the feedback resistor $R_1$ 107. The current feedback by the feedback resistor $R_1$ 107 is amplified by the feedback transistor $Q_2$ 105. As a result, a current flowing into the base of the emitter follower stage transistor $Q_2$ 103 is reduced in amount. Therefore, an amount of current increases according to the input power in the CLASS AB power amplifier may be controlled, such that optimized linearity and efficiency can be determined.

As widely known, an efficiency of the conventional power amplifier is based on a maximum output (about 28 dBm). However, the practical terminals are used at a low output (about 5~0 dBm) more frequently than at the maximum output. Thus, efficiency at a low output is important to extend duration of the battery, and there have been extensive studies on improvements of the power amplifier module.

A conventional method for improving efficiency of the power amplifier module uses a smart power amplifier having a low power mode and a high power mode. Most of operations of the bias circuit having a mode change type between the low power mode and the high power mode are performed by inserting a circuit for controlling an amount of current of the bias circuit. A switch circuit for subtracting some amount of current is added in a path where the reference current flows.

FIG. 2 is a circuit diagram 200 illustrating this conventional mode change bias circuit. That is, the conventional bias circuit 200 includes a switching transistor $Q_4$ 201 connected to a node $N_1$ 113 in the bias circuit 100 illustrated in FIG. 1. A collector of the switching transistor $Q_4$ 201 is connected to the node $N_1$ 113, an emitter thereof is grounded, and a base thereof is connected to a mode selection voltage source Vmode through a resistor $R_4$ 205.

According to this conventional bias circuit 200, in a high power mode, a low voltage (e.g., a logic low signal) is applied to the mode selection voltage source Vmode. Accordingly, the switching transistor $Q_4$ 201 is turned off so that the bias circuit 200 operates identically as the bias circuit 100 in FIG. 1 and some level of gain and linearity can be maintained to the point of highest power.

To the contrary, in a low power mode, a high voltage (e.g., a logic high signal) is applied to the mode selection voltage source Vmode. Accordingly, the switching transistor $Q_4$ 201 is turned on and a portion of the reference current flowing into the reference voltage source Vref of the bias circuit 100 is consumed. Therefore, the reference current flowing into the bias circuit is reduced. This lowers an operation point of the power amplifier transistor $Q_1$ 101 and reduces the gain and a current consumption and, as a result, the efficiency of operation in the low power mode can be improved.

Meanwhile, this conventional bias circuit 200, having a mode change type, further includes only the switching transistor $Q_4$ 201 as compared to the bias circuit 100 shown in FIG. 1, and uses only one bias circuit. Therefore, if the low power mode is performed in the conventional bias circuit 200 having a mode change bias circuit, the gain increases as the power increases.

Moreover, the mode change to the low power mode compulsorily reduces suitable initial current that should be used in the power amplifier originally because the conventional mode change bias circuit 200 performs the mode change by reducing the reference current. Therefore, in the low power mode, a gm (transconductance) of the power amplifier transistor decreases and thus the gain is reduced. The gain reduced by the decrease of current becomes independent of the initial current of the low power mode in respect of an amount of current as the input power increases. Therefore, the gm increases, and, as a result the gain, is likely to return to the original gain following that of the high power mode, such that a gain variation in power occurs. This gain variation in is an obstacle of reducing the initial current of the low power mode, and degrades an advantage of the low power mode at the boundary point between the low power and the high power.

In addition, if gain flatness is reduced to make the gain variation great, the gain of the power amplifier is not estimated as a fixed value. As a result, various parts for controlling gains according to the output of the power amplifier may not operate normally. This reduction of the gain flatness makes it difficult to set the initial current smaller when the low power mode is designed. The efficiency of low power mode becomes improved as the initial current is set to be as small as possible, but the gain variation in the power increases to restrict the reduction of the initial current.

Moreover, in case of using the convention mode change type bias circuit for reducing the reference current, if the power increases to specific input power, the bias circuit in the low power mode is not driven by a smaller current but by a larger current as if in the high power mode. This is an unavoidable problem due to the characteristics of the CLASS AB power amplifier requiring more current as the input power increases, and a feedback current should be controlled to effectively suppress the increase of the current. However, the conventional mode change bias circuit uses a single bias circuit, such that an amount of the feedback current is not controlled differently between the lower mode and high power mode because the identical bias circuit is used in the low power mode and the high power mode.

SUMMARY OF THE INVENTION

Embodiments of the present invention provide a bias circuit that can be optimized to a low power mode and a high power mode.

Specifically, in some embodiments of the present invention, the bias circuit for a power amplifier includes a first bias circuit and a second bias circuit that are connected to a power amplifier and a switching device for selectively dropping down the reference voltage source that is provided to each bias circuit.

In one embodiment of the present invention, the first bias circuit and the second bias circuit each includes two transistors. In each bias circuit, a base of a first transistor is connected to a collector of a second transistor through a first node, an emitter of the first transistor is connected to a base of the second transistor through a second node, a collector of the first transistor is connected to a power supply source, an emitter of the second transistor is grounded, the first node is connected to a reference voltage source, and the second node is connected to the power amplifier.

The switching device includes a first switching transistor, a second switching transistor, and a mode switching transistor. The first switching transistor and the second transistor of the switching device are connected between the first node and the reference voltage source of each bias circuit. The mode change transistor is connected to the mode selection voltage source and the second switching transistor. Each collector of the two switching transistors is connected to the first node of each bias circuit, each emitter of the two switching transistor is grounded, a base of the first switching transistor is connected to the mode selection voltage source, a base of the second switching transistor is connected to a collector of the mode switching transistor, an emitter of the mode switching transistor is grounded, and a collector of the mode switching transistor is connected to the reference voltage source.

In one embodiment of the present invention, each of the bias circuits further includes a reference resistor between the first node of each bias circuit and the reference voltage source, and a feedback resistor between the second node and the base of the second transistor of each bias circuit.

Preferably, each reference resistor of the bias circuits has a different value.

According to the present invention, when one of the bias circuits operates, the other does not operate. Therefore, the bias circuits in the high power mode and the low power mode may be divided and optimized according to the power. As a result, a gain variation in the power is reduced and the low power mode can be controlled with a small amount of current under a condition of an initial current with low power or a middle power, such that an efficiency of the power amplifier at the low power can be improved.

DETAILED DESCRIPTION OF THE PREFERRED EMBODIMENTS

The present invention will be described more fully hereinafter with reference to the accompanying drawings, in which exemplary embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
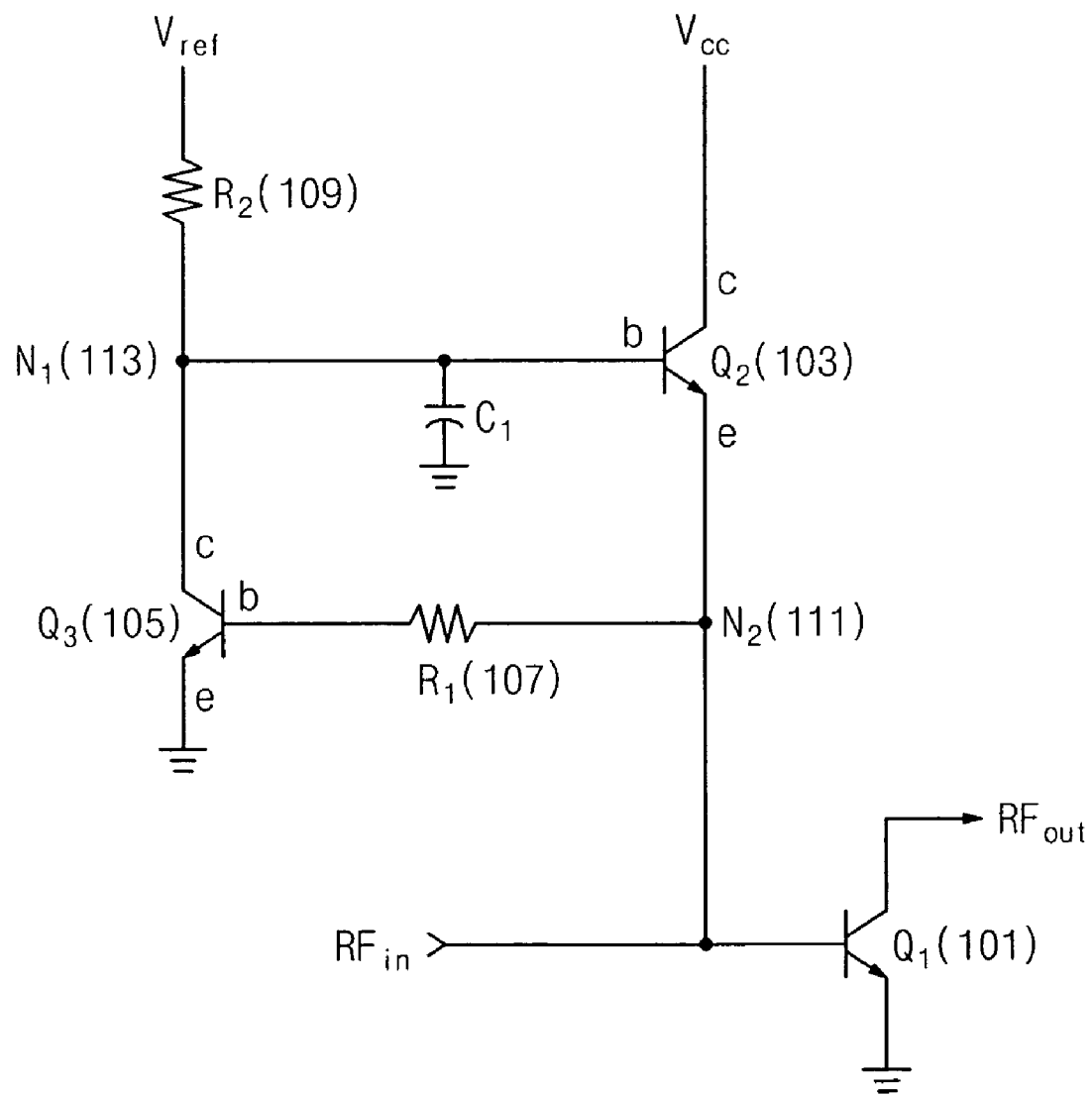
FIG. 1 is a circuit diagram illustrating a bias circuit of conventional power amplifier.
Figure 2:
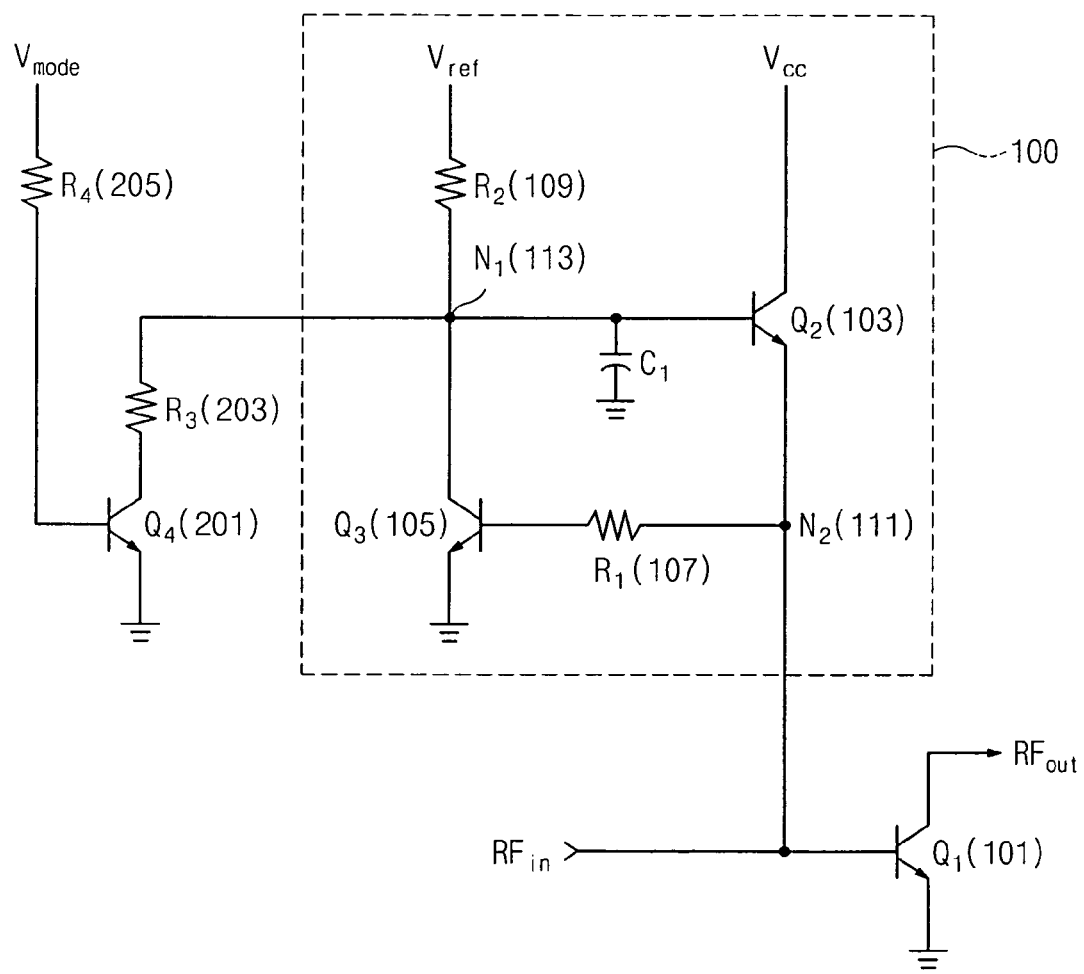
FIG. 2 is a circuit diagram illustrating a conventional double mode bias circuit.
Figure 3:
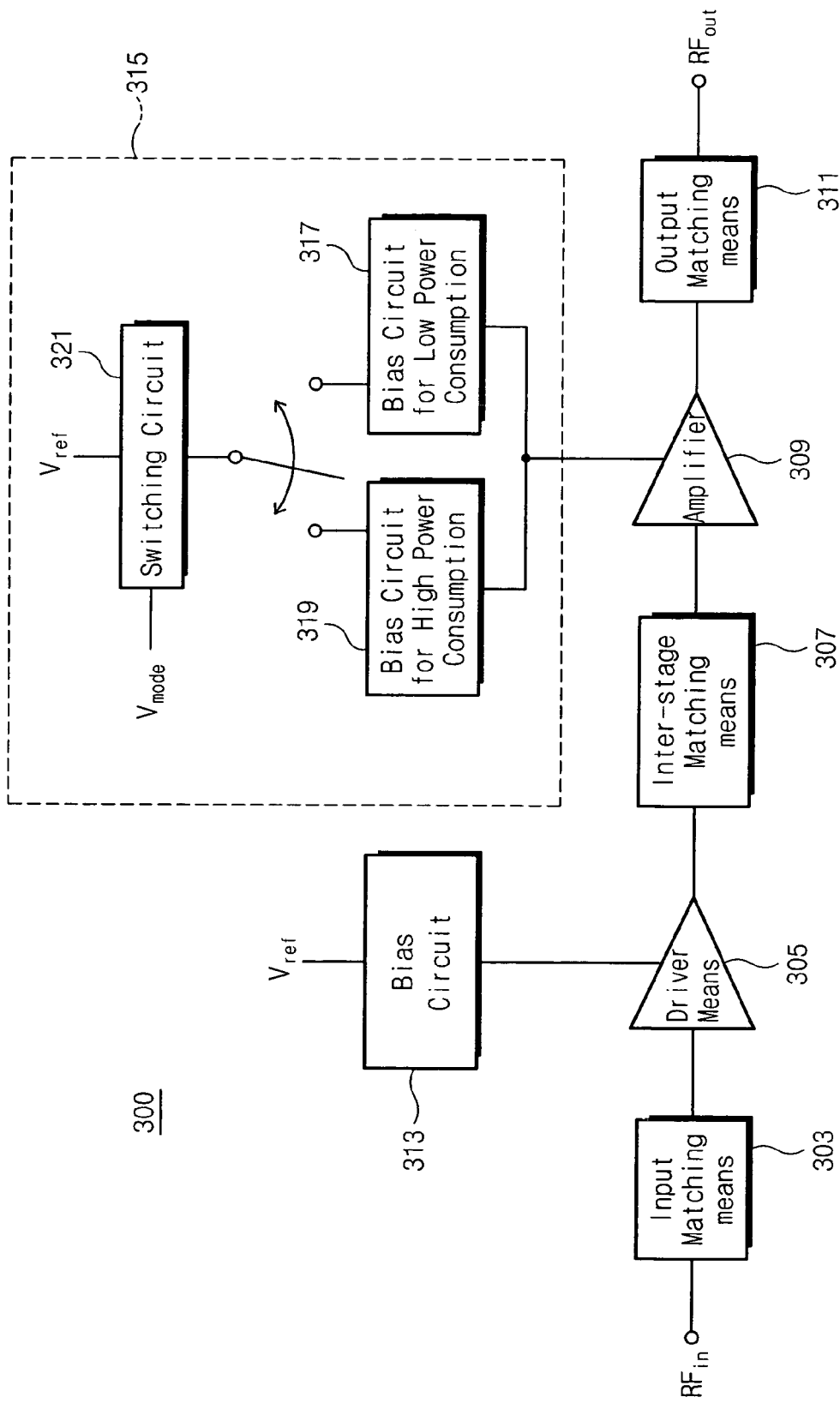
FIG. 3 is a schematic block diagram illustrating a module of a power amplifier according to one embodiment of the present invention.
Figure 4:
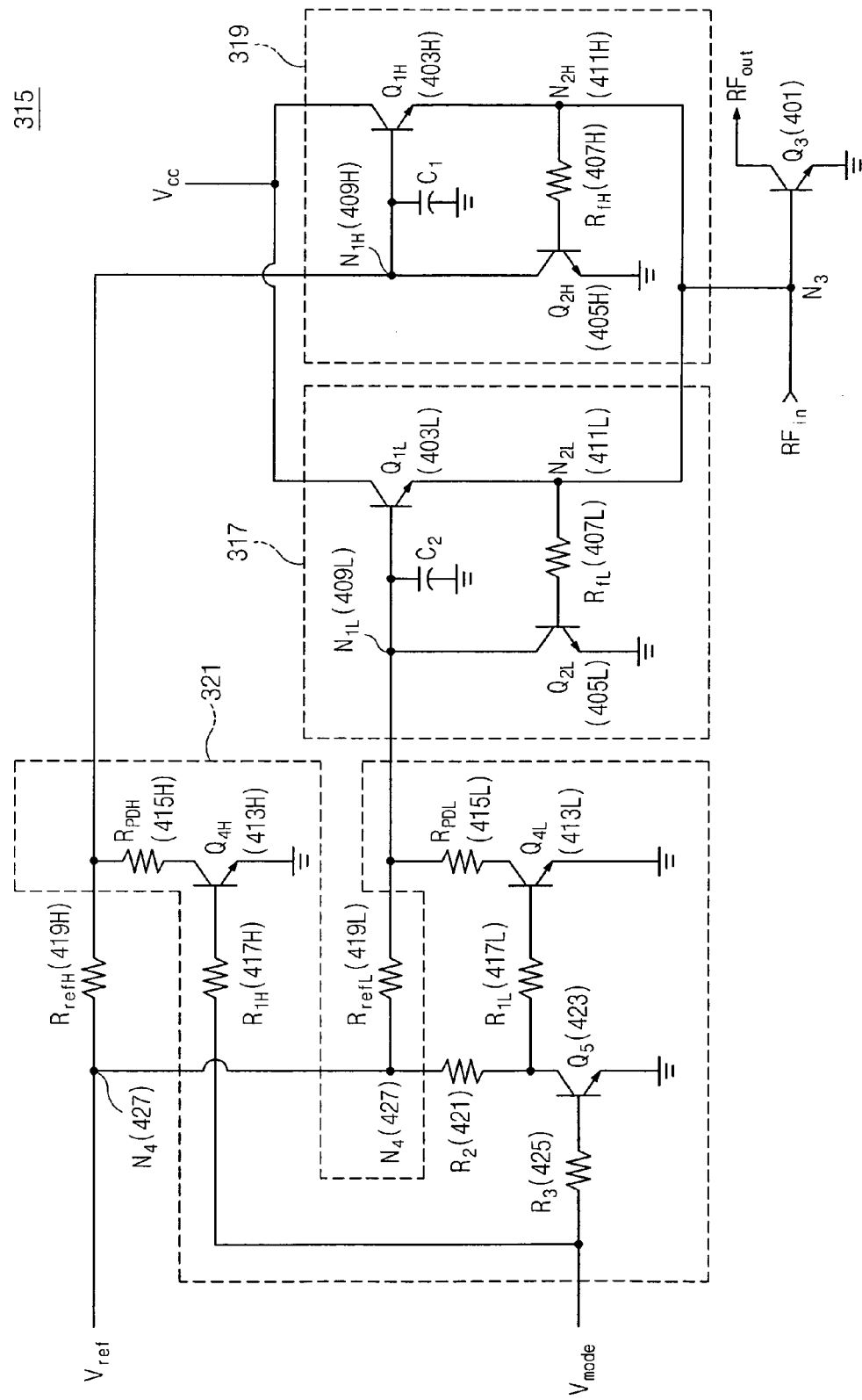
FIG. 4 is a circuit diagram illustrating a double mode bias circuit comprising the power amplifier of FIG. 3.

FIG. 3 is a schematic block diagram illustrating a power amplifier module 300 according to one embodiment of the present invention, and FIG. 4 is a circuit diagram illustrating a double mode bias circuit 315 comprising the module of a power amplifier of FIG. 3.

Referring to FIG. 3, the module 300 of the power amplifier according to the present invention includes an input matching means 303 connected to an input terminal RFin of a high-frequency signal, a driving stage 305 connected to the input matching means 303, an interstage matching means 307 connected to the driving stage 305, an amplifier stage 309 connected to the interstage matching means 307, an output matching means 311 connected to the amplifier stage 309, a high frequency signal output terminal RFout connected to the output matching means 311, a bias circuit 313 for biasing the driving stage 305 and a double mode bias circuit 315 for biasing the amplifier stage 309.

The input matching means 303 plays a role in minimizing a reflection of an input high frequency signal. The interstage matching means 307 matches signals between the transistor of the driving stage 306 and the transistor of the amplifier stage 309, and the output matching means 311 plays a role in optimizing power, linearity and efficiency of the output of the amplifier stage 309. The transistor of the driving stage 305 compensates a gain of the amplifier stage 309.

The double mode bias circuit 315 of the present invention includes a low power bias circuit 317, a high power bias circuit 319 and a switch circuit 321. The low and high power bias circuits 317 and 319 are optimized according to each power band and the switch circuit 321 activates the bias circuits 317 and 319 selectively. The switch circuit 321 selects to activate (drive) anyone of the high power bias circuit 319 and the low power bias circuit 317 according to a logic state of the mode selection voltage source Vmode.

For example, if the mode selection voltage source Vmode has a logic "high", the switch circuit 321 activates the low power bias circuit 317 selectively. If the mode selection voltage source Vmode has a logic "low", the switch circuit 321 selectively activates the high power bias circuit 319. If the high power bias circuit 319 and the low power bias circuit 317 are designed to have an optimized characteristic according to each power supply, gain flatness can be achieved according to each power supply. Therefore, an amount of the consumed current in a low power mode can be decreased to a degree of the minimum current amount in which linearity is secured or obtained.

FIG. 4 is a circuit diagram illustrating one embodiment of the double mode bias circuit 315 of FIG. 3. Referring to FIG. 4, the double mode bias circuit 315 according to the present invention includes a mode change switch circuit 321, a high power bias circuit 319 and a low power bias circuit 317, and serves as a provider for supplying suitable current according to an input current of a base of the amplifier terminal transistor $Q_3$ 401.

The low power bias circuit 317 and the high power bias circuit 319 use an emitter follower circuit employing a negative feedback circuit as a basic circuit, and are connected between a reference voltage source Vref and the base of the amplifier terminal transistor $Q_3$ 401 in parallel.

The low power bias circuit 317 includes a feedback transistor $Q_{2L}$ 405L connected the emitter of the emitter follower stage transistor $Q_{1L}$ 403L through a feedback resistor $R_{fL}$ 407L. The feedback transistor $Q_{2L}$ 405L is connected to a base of the emitter follower stage transistor $Q_{1L}$ 403L through a node $N_{1L}$ 409L. A collector of the emitter follower stage transistor $Q_{1L}$ 403L is connected to an operation voltage source Vcc and an emitter of the feedback transistor $Q_{2L}$ 405L is grounded. A base of the power amplifier stage transistor $Q_3$ 401 is connected to the node $N_{2L}$ 411L between the emitter follower terminal transistor $Q_{1L}$ 403L and the feedback resistor $R_{fL}$ 407L.

Similarly, the high power bias circuit 319 includes a feedback transistor $Q_{2H}$ 405H connected to an emitter of the emitter follower stage transistor $Q_{1H}$ 403H through a feedback resistor $R_{fH}$ 407H. The feedback transistor $Q_{2H}$ 405H is connected to a base of the emitter follower stage transistor $Q_{1H}$ 403H through a node $N_{1H}$. The collector of the emitter follower stage transistor $Q_{1H}$ 403H is connected to an operation voltage source Vcc and the emitter of the feedback transistor $Q_{2H}$ 405H is grounded. A base of the power amplifier transistor $Q_3$ 401 is connected to a node $N_{2H}$ 411H between the emitter follower terminal transistor $Q_{1H}$ 403H and the feedback resistor $R_{fH}$ 407H. The node $N_{1H}$ 409H of the high power bias circuit 319 is connected to a reference voltage source Vref through a reference resistance $R_{refH}$ 419H. The node $N_{1L}$ 409L of the lower power bias circuit 317 is connected to the reference voltage source Vref through a reference resistor $V_{refL}$ 419L. These high power bias circuit 319 and low power bias circuit 317 control resistances using the reference resistors $R_{refH}$ 419H and $R_{refL}$ 419L to provide current optimized with respect to each power supply band to a power amplifier terminal transistor $Q_3$ 401. Thus, current may be stably distributed with little effect by changes of fabrication process and temperature condition. For example, the reference resistance $R_{refH}$ 419H of the high power bias circuit 319 has a small value and the reference resistance $R_{refL}$ 419L has a large value. That is, the reference resistance $R_{refH}$ 419H is smaller than the reference resistance $R_{refL}$ 419L.

In addition, the amount of the feedback current can be controlled using the feedback resistor $R_{fH}$ 407H and $R_{fL}$ 407L. The current feedback by the feedback resistors $R_{fH}$ 407H and $R_{fL}$ 407L is amplified by the feedback transistors $Q_{2H}$ 405H and $Q_{2L}$ 405L and the current flowing into a base of the emitter follower stage transistors $Q_{1H}$ 403H and $Q_{1L}$ 403L are reduced as a result. Thus, an amount of current increase with respect to a power supply inputted from a CLASS AB power amplifier can be controlled.

If the amount of current increase is controlled properly, the optimized linearity and efficiency can be determined by each power supply. That is to say, the feedback resistance $R_{fH}$ 407H and $R_{fL}$ 407L are each set to different values, such that a most proper current increase is induced in a high power mode, and a minimum current increase is induced according to the input power supply regardless of characteristics of the high power mode to improve an efficiency at the low power. For instance, the feed back resistance $R_{fH}$ 407H of the high power bias circuit 319 has a large value and the feedback resistance of the low power bias circuit 317 has a small value. That is, the feedback resistance $R_{fH}$ 407H is larger than the feedback resistance $R_{fL}$ 407L.

Referring to FIG. 4, the mode change switch circuit 321 of the double mode bias circuit 315 of the present invention will be described herein. The mode change switch circuit 321 includes three transistors $Q_{4H}$ 413H, $Q_{4L}$ 413L and $Q_5$ 423 and resistors $R_{PDH}$ 415H, $R_{PDL}$ 415L, $R_{1H}$ 417H, $R_{1L}$ 417L, $R_2$ 421 and $R_3$ 425. A mode selection voltage source Vmode determines whether the transistor $Q_5$ 423 (i.e., a mode change transistor) starts to operate or not. According to this, the current switching transistors $Q_{4H}$ 413H and $Q_{4L}$ 413L are determined whether to operate or not and then the high power bias circuit 319 and the low power bias circuit 317 are determined whether to operate or not finally.

A base of the transistor $Q_5$ 423 (i.e., a mode change transistor) is connected to a mode selection voltage source Vmode through the resistor $R_3$ 425, an emitter thereof is grounded, and a collector thereof is connected to a reference voltage source Vref through the resistor $R_2$ 421. That is, the reference resistors $R_{refH}$ 419H, $R_{refL}$ 419L and the resistor $R_2$ 421 are connected to the reference voltage source Vref through the common node $N_4$ 427.

A transistor $Q_{4H}$ 413 (i.e., a transistor for high power switch) is connected to the node $N_{1H}$ 409H of the high power bias circuit 319 and the mode selection voltage source Vmode. A transistor $Q_{4L}$ 413L (i.e., a transistor for low power switch) is connected to a node $N_{1L}$ 409L of the low power bias circuit 317 and a reference voltage source Vmode. Specifically, an emitter of the high power switching transistor $Q_{4H}$ 413H is grounded and a collector thereof is connected between the reference resistor $R_{refH}$ 419H and the node $N_{1H}$ 409H through a pull-down resistor $R_{PDH}$ 415H, and a base thereof is connected between the mode selection voltage source Vmode and the resistor $R_3$ 425 through the resistor $R_{1H}$ 417H. Meanwhile, an emitter of the low power current switching transistor $Q_{4L}$ 413L is grounded, a collector thereof is connected between the reference resistor $R_{refL}$ 419L and a node $N_{1L}$ through the pull-down resistor $R_{PDL}$ 415L, and a base thereof is connected between the collector of the mode change transistor $Q_5$ 423 and the resistor $R_2$ 421 through the resistor $R_{1L}$ 417L.

According to this mode change switch circuit 321, the magnitude of the mode selection voltage source Vmode determines whether the mode change transistor $Q_5$ 423 operates (electrifies) or not. According to this, the current switching transistors $Q_{4H}$ 413H and $Q_{4L}$ 413L are determined to operate or not and thus the high power bias circuit 319 and the low power bias circuit 317 are determined to operate or not. For example, if the mode change transistor $Q_s$ 423 operates, the low power bias circuit 317 operates.

The operation of the mode change bias circuit 315 will be fully described herein according to the present invention.

First, the operation in a high power mode will be explained. In high power mode, the mode selection voltage source Vmode becomes 0 volts and the mode change transistor $Q_5$ 425 does not operate, and the high power current switching transistor $Q_{4H}$ 413H, which is connected between the mode selection voltage source Vmode and the resistor $R_3$ 425, does not operate either because the mode selection voltage source Vmode is 0 volts. Contrary to this, the low power current switching transistor $Q_{4L}$ 413L connected to the reference voltage source Vref operates if values of the reference resistor $R_{refL}$ 419L and the pull-down resistor $R_{PDL}$ 415L are controlled properly to form a suitable voltage and a flow current. When the low power current switching transistor $Q_{4L}$ 413L operates, a voltage drops down in the node $N_{1L}$ 409L of the low power bias circuit 317. Therefore, a suitable reference voltage capable of driving the lower power bias circuit 317 is not formed. As a result, the emitter follower transistor $Q_{1L}$ 403L of the low power bias circuit 317 is not driven and the base terminal of the amplifier stage transistor Q3 401 is not provided with a current.

Meanwhile, because the high power current switching transistor $Q_{4H}$ 413H does not operate, the reference voltage source provides a reference voltage without an obstruction due to a voltage drop in the node $N_{1H}$, that is directly connected to the reference voltage source Vref providing the reference voltage to the high power bias circuit 319. Therefore, the high power bias circuit 319 operates normally and current is supplied to the base of the amplifier stage transistor $Q_3$ 401. Only the high power bias circuit 319 of the two bias circuits operates normally and the amplification of the power is optimized in the high power mode. Therefore, a current is supplied only to the base of the amplifier stage transistor $Q_3$ 401. As a result, only high power bias circuit 319 of the two bias circuits operates normally and the power amplification is optimized in the high power mode.

Next, the operation in a low power mode will be explained. If the mode selection voltage source Vmode becomes, for example, about 3 volts (i.e., a logic high signal), the mode change transistor $Q_5$ 425 starts to operate. In addition, the high power current switching transistor $Q_{4H}$ 413H connected between the mode selection voltage source Vmode and the resistor $R_3$ 425 operates either. As the high power switching transistor $Q_{4H}$ 413H operates, a collector of the high power switching transistor $Q_{4H}$ 413H becomes approximately 0 volts. Therefore, a voltage of a reference voltage of the high power bias circuit (i.e., a node $N_{1H}$ 409H) connected to the high power bias circuit 317 drops down, thereby not providing a suitable reference voltage source capable of driving the high power bias circuit 319. As a result, the emitter follower transistor $Q_{1H}$ 403H of the high power bias circuit 319 does not operate, and a current is not supplied to the base of the amplifier terminal transistor $Q_3$ 401.

To the contrary, if the mode selection voltage source Vmode becomes 3 volts to operate the mode change transistor $Q_s$ 423, a voltage of collector drops down near to 0 volts. Therefore, the low power switching transistor $Q_{4L}$ 413L does not operate and a voltage of the reference voltage of the low power bias circuit 317 (i.e., a node $N_{1L}$ 409L) is maintained normally, to drive the low power bias circuit 319 and a current is supplied to the base of the amplifier terminal transistor $Q_3$ 403.

As explained above, the double mode bias circuit of the present invention drives only one of the high power bias circuit and the low power bias circuit according to the voltage of the mode selection voltage source. The high power bias part and the low power bias part may be independently designed and be optimized in accordance with each power level. Especially, the low power bias circuit can be embodied to use a minimum current without consideration of the high power characteristic, such that the gain variation in the power can be reduced and a power amplifier having good efficiency can be embodied.

The reference resistor $R_{refH}$ 419H may be connected between the node $N_{1H}$ 419H and the pull-down resistor $R_{PDH}$ connected to the collector of the high power current switching transistor $Q_{4H}$ 413H. Similarly, the reference resistor $R_{refL}$ 419L may be connected between the node $N_{1L}$ 419L and the pull-down resistor $R_{PDL}$ connected to the collector of the high power current switching transistor $Q_{4L}$ 413L. In this case, the operations of the high power mode and the low power mode are performed in the same way as explained above.

In the fully explained embodiments, each of the bias circuits is optimized to a different power, but it is possible to be optimized in a different frequency bands.

A double bias mode circuit according to the present invention uses a method of differently setting a reference resistor for determining a reference current instead of a method of subtracting a current by directly connecting a switching transistor in a path where the reference current flows. Therefore, a current can be stably distributed with little effect by process variation and temperature compared to the mode change method, which depends on a transistor.

In addition, feedback resistors are set to different values to lead optimized increase of current in a high power mode, and to lead a minimum increase of current in accordance with the input power in a low power mode. Thus, an efficiency of the low power can be improved.

According to the present invention, the double bias circuit makes the feedback current increase further using a small feedback resistor in the independent low power mode bias circuit compared to that of the high power mode bias circuit. As a result, the current increase of the power amplifier transistor can be suppressed. A gain characteristic can be made to be flat according to the power, such that a current dissipation of the low power mode can be reduced to a minimum degree capable of ensuring linearity. Therefore, a maximum efficiency can be embodied.

Moreover, the present invention can reduce the gain difference with respect to the power because an optimized bias circuit is driven by describing a high power characteristic and a low power characteristic. Therefore, the gain does not vary in each of the high power mode and the low power mode and the bias circuit according to the present invention can perform stable operations in a wireless terminal system.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A bias circuit comprising:
a first bias circuit and a second bias circuit connected to a reference voltage source and a power amplifier and providing different currents for the power amplifier;
a switching device for selectively dropping down a voltage level of the reference voltage source that is provided to each bias circuit, wherein the first bias circuit and the second bias circuit each includes a first transistor and a second transistor,
wherein a base of the first transistor is connected to a collector of the second transistor through a first node, an emitter of the first transistor is connected to a base of the second transistor through a second node, a collector of the first transistor is connected to a power supply source, an emitter of the second transistor is grounded, the first node is connected to the reference voltage, and the second node is connected to the power amplifier in each bias circuit,
wherein the switching device includes a first switching transistor and a second switching transistor connected between the first node and the reference voltage source, and a mode change transistor connected between a mode selection voltage source and the second switching transistor,
wherein each collector of the switching transistors is connected to the first node of each bias circuit, each emitter of the switching transistors is grounded, a base of the first switching transistor is connected to the mode selection voltage source, a base of the second switching transistor is connected to a collector of the mode change transistor, an emitter of the mode change transistor is grounded, and a collector of the mode change transistor is connected to the reference voltage source.

2. The bias circuit of claim 1, further comprising a reference resistor between the first node of each bias circuit and the reference voltage source; and
a feedback resistor between the second node and the base of the second transistor of each bias circuit.

3. The bias circuit of claim 2, wherein each of the bias circuits has a different reference resistor and a different feedback resistor.

4. The bias circuit of claim 2, wherein the reference resistors of each of the bias circuits has a different value.

5. The bias circuit of claim 3, wherein a resistance of the reference resistor in one bias circuit is larger than the resistance of a reference resistor in the other bias circuit, and a resistance of the feedback resistor of the one bias circuit is smaller than a resistance of the other bias circuit.

6. The bias circuit of claim 4, wherein a resistance the reference resistor in one bias circuit is larger than the resistance of a reference resistor in the other bias circuit, and a resistance of the feedback resistor of the one bias circuit is smaller than a resistance of the other bias circuit.

7. A bias circuit, comprising:
a first bias circuit and a second bias circuit connected in parallel between a reference voltage source and a power amplifier; and
a switching device connected between a mode selection voltage source and each of the first and second bias circuits,
wherein the switching device includes a first switching transistor and a second switching transistor of which collectors are connected between each of the bias circuits and the reference voltage source, and a mode change transistor is connected between the mode selection voltage source and the second switching transistor, and
wherein each emitter of the switching transistors is grounded, a base of the first switching transistor is connected to the mode selection voltage source, a base of the second switching transistor is connected to a collector of the mode change transistor, an emitter of the mode change transistor is grounded, and a collector is connected to the reference voltage source, wherein each of the first bias circuit and the second bias circuit includes two transistors,
wherein the base of the first transistor is connected to the collector of the second transistor through a first node, the emitter of the first transistor is connected to the base of the second transistor through the second node, the collector of the first transistor is connected to a power supply source, the emitter of the second transistor is grounded, the first node is connected to a collector of the switching transistor, and the second node is connected to the power amplifier in each of the bias circuits.

8. The bias circuit of claim 7, wherein each of the first and second bias circuits each include a reference resistor and a feedback resistor.

9. The bias circuit of claim 8, wherein the reference resistor of the first bias circuit includes a different value than the reference resistor of the second bias circuit.

10. The bias circuit of claim 8, wherein the feedback resistor of the first bias circuit includes a different value than the feedback resistor of the second bias circuit.

11. The bias circuit of claim 8, wherein a resistance of the reference resistor in one bias circuit is larger than the resistance of a reference resistor in the other bias circuit, and a resistance of the feedback resistor of the one bias circuit is smaller than a resistance of the other bias circuit.

* * * * *